United States Patent
Kinzer et al.

(10) Patent No.: US 6,653,740 B2
(45) Date of Patent: Nov. 25, 2003

(54) VERTICAL CONDUCTION FLIP-CHIP DEVICE WITH BUMP CONTACTS ON SINGLE SURFACE

(75) Inventors: Daniel M. Kinzer, El Segundo, CA (US); Aram Arzumanyan, Burbank, CA (US); Tim Sammon, Helensburgh (GB)

(73) Assignee: International Rectifier Corporation, El Segundo, CA (US)

( * ) Notice: Subject to any disclaimer, the term of this patent is extended or adjusted under 35 U.S.C. 154(b) by 4 days.

(21) Appl. No.: 09/780,080

(22) Filed: Feb. 9, 2001

(65) Prior Publication Data

US 2001/0045635 A1 Nov. 29, 2001

Related U.S. Application Data

(60) Provisional application No. 60/181,504, filed on Feb. 10, 2000, and provisional application No. 60/224,062, filed on Aug. 9, 2000.

(51) Int. Cl.[7] .................. H01L 27/01; H01L 29/90; H01L 23/48; H01L 29/40; H01L 23/34
(52) U.S. Cl. .................. 257/778; 257/737; 257/738; 257/780; 257/779; 257/242; 257/236; 257/263; 257/341; 257/342; 257/220
(58) Field of Search .................. 257/737, 738, 257/778, 779, 220, 236, 242, 263, 213, 278, 341, 780, 342

(56) References Cited

U.S. PATENT DOCUMENTS

| | | | |
|---|---|---|---|
| 3,761,782 A | * | 9/1973 | Youmans |
| 4,205,099 A | | 5/1980 | Jones et al. |
| 4,405,932 A | * | 9/1983 | Ishii et al. |
| 4,416,054 A | | 11/1983 | Thomas et al. |
| 4,484,214 A | * | 11/1984 | Misawa et al. |
| 5,077,229 A | | 12/1991 | Forlani |
| 5,216,278 A | | 6/1993 | Lin et al. ............ 257/688 |
| 5,241,133 A | | 8/1993 | Mullen, III et al. ....... 257/786 |
| 5,352,926 A | | 10/1994 | Andrews .............. 257/717 |
| 5,355,283 A | | 10/1994 | Marrs et al. ........... 257/687 |
| 5,416,351 A | * | 5/1995 | Ito et al. .............. 257/357 |
| 5,467,253 A | | 11/1995 | Heckman et al. ........ 257/698 |
| 5,578,841 A | | 11/1996 | Vasquez et al. |
| 5,583,376 A | | 12/1996 | Sickler et al. .......... 257/702 |
| 5,592,025 A | | 1/1997 | Clark et al. ........... 257/774 |
| 5,674,785 A | | 10/1997 | Akram et al. .......... 437/217 |
| 5,731,709 A | | 3/1998 | Pastore et al. ......... 324/760 |
| 5,734,201 A | | 3/1998 | Djennas et al. ......... 257/783 |

(List continued on next page.)

OTHER PUBLICATIONS

International Search Report dated May 23, 2001 for corresponding International Application No. PCT/US01/04164.

(List continued on next page.)

*Primary Examiner*—Alexander O. Williams
(74) *Attorney, Agent, or Firm*—Ostrolenk, Faber, Gerb & Soffen, LLP (57) ABSTRACT

A flip-chip MOSFET structure has a vertical conduction semiconductor die in which the lower layer of the die is connected to a drain electrode on the top of the die by a diffusion sinker or conductive electrode. The source and gate electrodes are also formed on the upper surface of the die and have coplanar solder balls for connection to a circuit board. The structure has a chip scale package size. The back surface of the die, which is inverted when the die is mounted may be roughened or may be metallized to improve removal of heat from the die. Several separate MOSFETs can be integrated side-by-side into the die to form a series connection of MOSFETs with respective source and gate electrodes at the top surface having solder ball connectors. Plural solder ball connectors may be provided for the top electrodes and are laid out in respective parallel rows. The die may have the shape of an elongated rectangle with the solder balls laid out symmetrically to a diagonal to the rectangle.

14 Claims, 9 Drawing Sheets

U.S. PATENT DOCUMENTS

| | | | | |
|---|---|---|---|---|
| 5,807,783 A | * | 9/1998 | Gaul et al. | 438/406 |
| 5,831,337 A | | 11/1998 | Sato | |
| 5,831,832 A | | 11/1998 | Gillette et al. | 257/738 |
| 5,841,197 A | * | 11/1998 | Adamic, Jr. | 257/777 |
| 5,844,168 A | | 12/1998 | Schueller et al. | 257/693 |
| 5,856,695 A | * | 1/1999 | Ito et al. | 257/370 |
| 5,858,815 A | | 1/1999 | Heo et al. | 438/112 |
| 5,866,939 A | | 2/1999 | Shin et al. | 257/666 |
| 5,866,942 A | | 2/1999 | Suzuki et al. | 257/498 |
| 5,866,949 A | | 2/1999 | Schueller | 257/778 |
| 5,883,432 A | | 3/1999 | Higashiguchi | 257/727 |
| 5,883,438 A | | 3/1999 | Kang | 257/778 |
| 5,889,332 A | | 3/1999 | Lawson et al. | 257/778 |
| 5,892,273 A | | 4/1999 | Iwasaki et al. | 257/690 |
| 5,892,288 A | | 4/1999 | Muraki et al. | 257/778 |
| 5,994,739 A | * | 11/1999 | Nakagawa et al. | 257/350 |
| 6,117,299 A | * | 9/2000 | Rinne et al. | 205/125 |
| 2002/0081773 A1 | * | 6/2002 | Inoue et al. | 438/108 |

OTHER PUBLICATIONS

Satoshi Tanigawa et al., The Resin Molded Chip Size Package (MCSP), publication date Oct. 2, 1995, IEEE/CPMT Int'l Electronics Manufacturing Technology Symposium, pp. 410–415.

Shunchi Matsuda et al., Simple–Structure, Generally Applicable Chip–Scale Package, publication date May 21, 1995, IEEE/CPMT Int'l Electronics Manufacturing Technology Symposium, pp. 218–223.

Pradeep Lall et al., Reliability Characterization of the SLICC Package, publication date May 28, 1996, 1996 IEEE Electronic components and Technology Conference, pp. 1202–1210.

Known Good Die and Chip Scale Packaging, BPA (Technology & Management) Ltd., Sep. 1995, Report No. 588, pp. 111–112.

* cited by examiner

VERTICAL CONDUCTION FLIP-CHIP DEVICE WITH BUMP CONTACTS ON SINGLE SURFACE

RELATED APPLICATIONS

This application relates to and claims the filing date of Provisional Application Serial No. 60/181,504, filed Feb. 10, 2000 and further relates to and claims the filing date of Provisional Application Serial No. 60/224,062, filed Aug. 9, 2000.

BACKGROUND OF THE INVENTION

This invention relates to semiconductor device packages and the method of making such packages and more specifically relates to a chip-scale package and method of its manufacture.

Semiconductor device packages are well known for housing and protecting semiconductor die and for providing output connections to the die electrodes. Commonly, the semiconductor die are diced from a large parent wafer in which the die diffusions and metallizing are made in conventional wafer processing equipment. Such die may be diodes, field effect transistors, thyristors and the like. The die are fragile and the die surfaces must be protected from external environment. Further, convenient leads must be connected to the die electrodes for connection of the die in electrical circuits.

Commonly, such die are singulated from the wafer, as by sawing, and the bottom of the die is mounted on and connected to a portion of a circuit board which has conforming sections to receive respective die. The top electrodes of the die are then commonly wire bonded to other portions of the circuit board, which are then used for external connections. Such wire connections are delicate and slow the mounting process. They also provide a relatively high resistance and inductance.

It is desirable in many applications that the packaged semiconductor devices be mountable from one side of the package, to enable swift and reliable mounting on a circuit board, as well as low resistance connections.

SUMMARY OF THE INVENTION

This invention provides a novel semiconductor die package comprising a "flip-chip" that is mountable on a circuit board or other electronic interface using one surface of the chip. In particular, the package has contacts, for example, gate, source and drain electrode contacts (for a MOSFET) on the same side of the package, and can be mounted by forming solder ball contacts on the surface of the chip which interface with the external gate, source and drain connections respectively on the circuit board.

The source connection to the chip is made with solder balls on the source electrode of the chip, the solder balls being positioned so that they will interface with appropriate source electrical connections on the circuit board. The package is configured so that the drain electrode is on the same surface.

In one embodiment, the active junctions reside in a layer of relatively low carrier concentration (for example P⁻) below the source electrode and above a substrate of relatively high carrier concentration of the same type (for example, P⁺). At least one drain electrode is positioned on the same surface at a region separate from the source electrode. A diffusion region or "sinker" extends from and beneath the top drain electrode, through the layer of relatively low carrier concentration to the substrate. The diffusion region has the same carrier concentration and type as the substrate (for example, P⁺). Thus, an electrical path is established from the source electrode, through the active elements, and into the substrate, through the diffusion region and to the top drain electrode.

As noted, the drain electrode is on the same surface as the source and gate electrodes and can thus be mounted to the circuit board using solder balls that correspond to locations of appropriate external drain connections.

In another embodiment, instead of using diffusion regions beneath the drain contacts, the layer of relatively low carrier concentration may be etched to the substrate and filled with the drain electrode. This may be done concurrently with the step of etching trenches for a vertical conduction trench-type device, for example.

In a still further embodiment of the invention, two vertical conduction MOSFET devices are formed in a common chip, with their source regions being laterally interdigitated and with a common drain substrate. This structure forms an inherent bidirectional switch. All contacts are available at the top surface, and the contact balls may be located along straight rows which may be symmetrical around a diagonal to a rectangular chip to simplify connection to a circuit board support. The bottom of the chip may have a thick metal layer to provide a low resistance current path between adjacent devices with common drains. It can also improve thermal conduction when the chip is mounted with its top surface facing a printed circuit board support.

Other features and advantages of the present invention will become apparent from the following description of the invention which refers to the accompanying drawings.

DETAILED DESCRIPTION OF THE PREFERRED EMBODIMENTS

FIGS. 1 to 6 show a first embodiment of the invention which is in the form of a flip-chip power MOSFET having all electrodes in one planar surface and having contact bumps to enable contact to traces or other electrical conductors of a support structure such as a printed circuit board. The device to be described could be any other type device such as a P/N or Schottky diode, an IGBT, a thyristor, an integrated circuit die having plural components and the like. Further, the device of FIGS. 1 to 6 is shown as a P channel device. The conductivity types can be reversed to make an N channel device. Further, the device of FIGS. 1 to 6 is shown as a trench type device, but it could be a planar cellular or stripe structure as well as will be later described.

Figure 1:
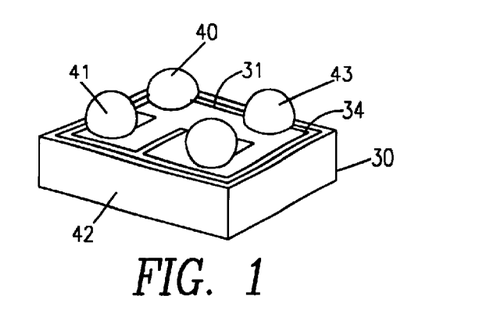
FIG. 1 is a perspective view of a first embodiment of the invention.

The completed device, ready for mounting, is shown in FIG. 1 and consists of a silicon die 30 having upper source electrode metallizing 31 (usually aluminum which may be from 2 microns to 8 microns thick), drain electrode metallizing 32 and gate electrode metal pad 33 (FIG. 2) and gate bus 34.

Figure 2:
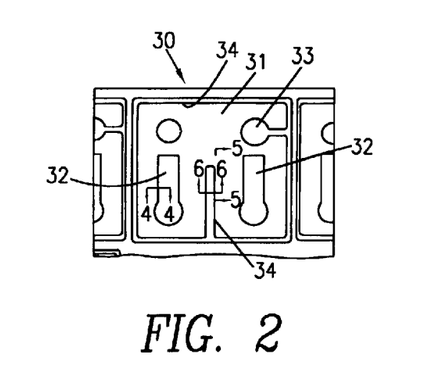
FIG. 2 is a top view of the metallizing pattern of the device of FIG. 1, prior to the formation of the contact bumps.
Figure 3:
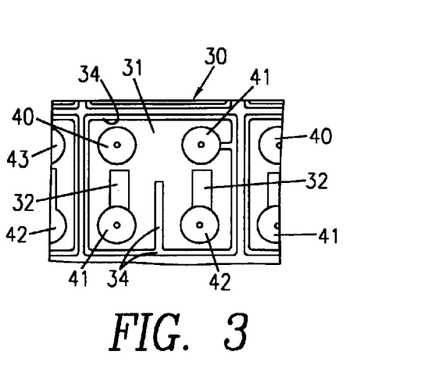
FIG. 3 shows the wafer of FIG. 2 after the formation of solder bumps.

The die is processed in wafer form, as partly shown in FIGS. 2 and 3. Contact balls are formed on the wafer, shown in FIGS. 1, 3 and 4 as source contact ball 40 on source metal 31, drain contact balls 41 and 42 on drain contact metallizing 32 and gate contact ball 43 on gate pad metallizing 33. The die within the wafer are then singulated and are ready for assembly on a circuit board or the like.

Figure 4:
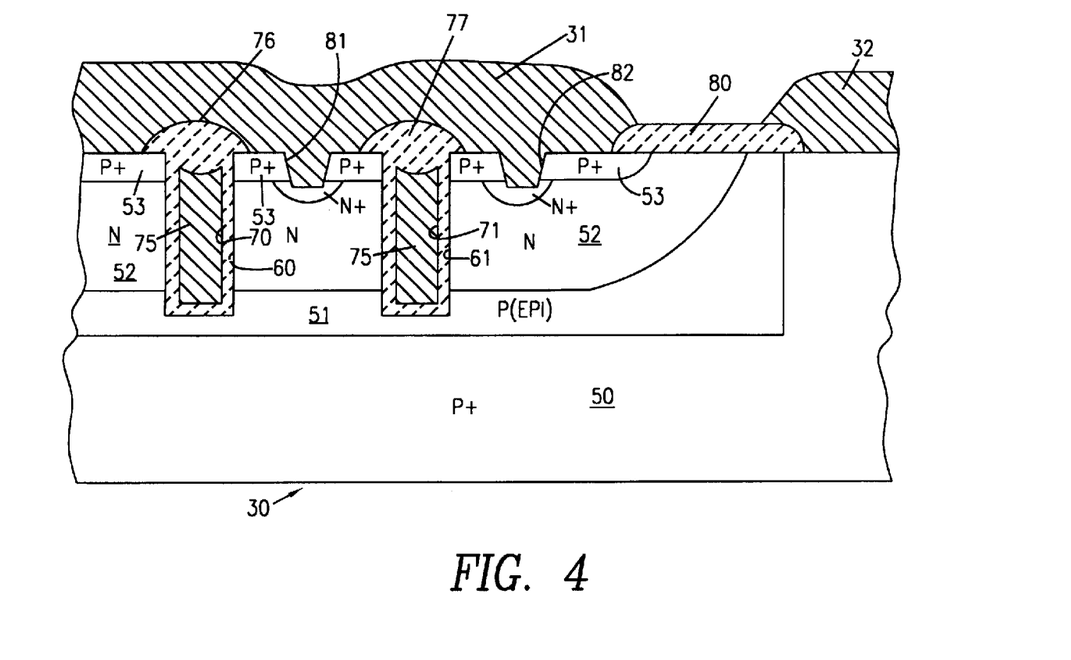
FIG. 4 is a cross section of FIG. 2 taken through a small area corresponding to the area at section line 4—4 in FIG. 2, and shows the source and drain top metallizations.
Figure 5:
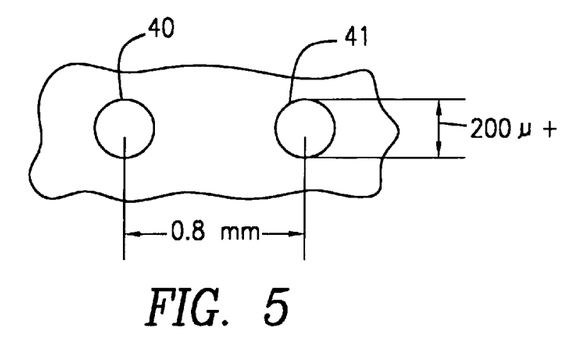
FIG. 5 is a layout showing the size and spacing of the contact balls of FIGS. 1 and 3.
Figure 6:
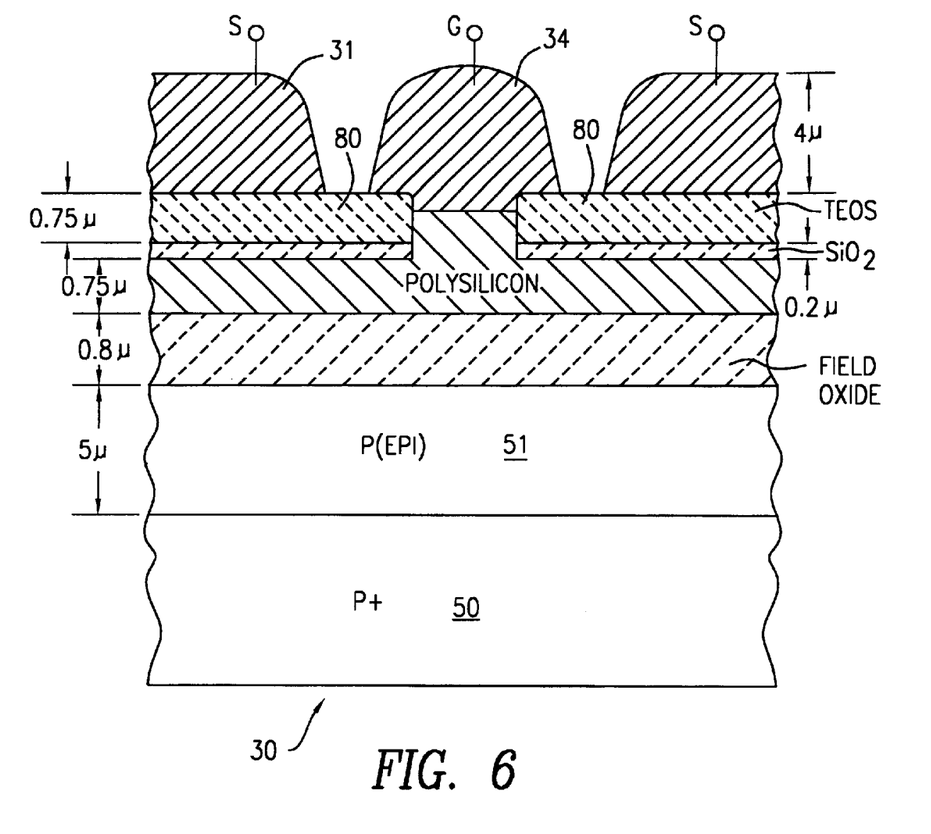
FIG. 6 is a cross-section of FIG. 2 taken across section line 6—6 in FIG. 2 and across the gate bus.

FIGS. 4 and 6 show a trench-type power MOSFET geometry for the device of FIGS. 1 and 3. Thus, for a P channel device, a P+ silicon substrate 50 is used and a lower concentration P type, junction receiving layer 51 is epitaxially grown atop P+ substrate 50. An N type base or channel diffusion 52 (FIGS. 4 and 5) is then formed.

Thereafter, and using conventional techniques, a plurality of parallel trenches 60, 61, (FIG. 4) or an array of intersecting trenches forming isolated mesa regions. A thin insulation layer, such as silicon dioxide is then grown on the walls of each of trenches 60 to 64, shown as gate insulation layers 70 to 74 respectively. A conductive polysilicon gate 75 is then deposited into each of the trenches and over the gate oxide layers and is then etched away to leave polysilicon only in the trenches and gate bus and pad regions. After that, a TEOS layer 80 is deposited and patterned, leaving insulation caps 76 and 77 (which may be TEOS) over the top of the polysilicon 75 in trenches 60 and 61 (FIG. 4).

A P+ source diffusion 53 is formed in the top of N diffusion 52 are etched through layers 52 and 53. Contact openings 81 and 82 (FIG. 4) are next etched through the P+ source layer 53 and into channel layer 52, and N+ contact diffusions are formed in the bottoms of openings 81 and 82. The dielectric material is then etched laterally to expose a portion at the source regions on the die surface for contact. A continuous aluminum layer is then deposited atop the surface of the device, with the aluminum contacting the P+ source regions 53 and N type channel regions 52. This aluminum layer is separated, by etching, into source contact 31, drain contact 32 and gate pad 33.

FIG. 5 shows the novel configuration of contact balls 40 and 41. These solder balls are formed by a well known process employing a nickel-gold plating, followed by the stencil printing of solder, and flowing the solder to form balls. Thus, the solder balls or bumps are on 0.8 mm centers which is a wider pitch than is conventionally used. By using a pitch of 0.8 mm or larger, the flip chip structure of the invention can mimic the application and attachment of conventional chip scale packages to a circuit board with conventional traces, using conventional surface mount techniques. The solder balls 40 and 41 are conventionally thermosonically welded onto a surface, but have a larger diameter than those previously used, for example, 200µ or greater, compared to the standard 150µ. By using a larger diameter, thermal conduction is enhanced and resistance to thermal fatigue is improved.

Figure 7:
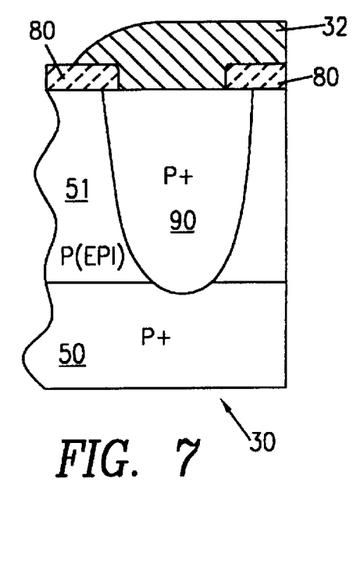
FIG. 7 shows the use of a P⁺ sinker diffusion to enable the connection of a top contact of drain metal to the P⁺ substrate.
Figure 8:
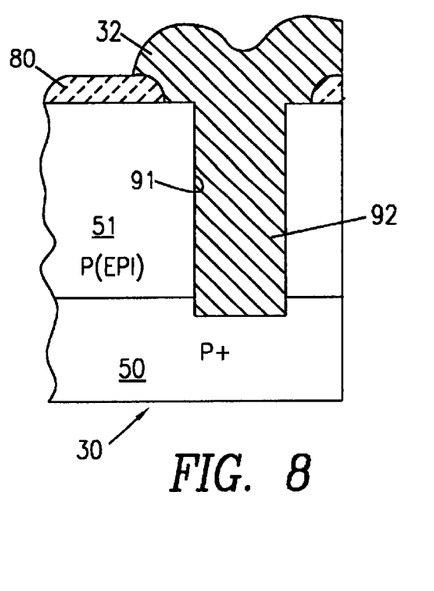
FIG. 8 shows a modified contact structure for making contact from the top surface drain of FIG. 4 to the P⁺ substrate.

In FIG. 4, the drain metal 32 is shown as contacting an upwardly extending portion of P+ substrate 50. This is a schematic representation, and in practice, the contact from surface drain 32 to P+ substrate 50 is made as shown in FIG. 7 or 8. Thus, in FIG. 7, a P+ "sinker" diffusion 90 is employed to make the contact. In FIG. 8, a trench 91 is formed, as during the trench etching process for making the active area, and is filled with metal or conductive polysilicon 92.

The operation of the device of FIGS. 1 to 8 will be apparent to those of ordinary skill. Thus, to turn the device on, and with suitable potentials applied to the source and drain electrodes 31 and 32, the application of a gate potential to gate 75 will cause the N type silicon adjacent the gate oxide layers 70 to 74 to invert to the P type, thus completing a circuit from source electrode 31, through source regions 53, through the inversion regions to P region 51, P+ substrate 50 and then laterally through P+ substrate 50 and upwardly (through regions 90 or 92) to drain electrode 31.

Figure 20:
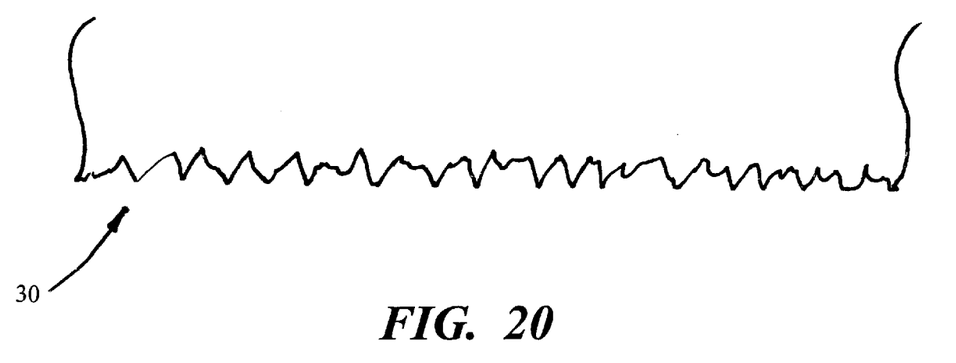
FIG. 20 shows a cross-sectional view of a lower surface of a die according to the present invention.

The novel device of FIGS. 1 to 8 brings the size of the device ready for mounting to a minimum; that is, to the size of the die. The die itself has an extremely low RDSON, using a vertical construction, cellular trench technology. For example, the design can employ over $110 \times 10^6$ cells per in$^2$. However, unlike the standard trench FET design, the drain connection is brought to the front or top of the die. There is no need for back-grinding the bottom die surface or for metal deposition on the bottom surface of the die. By not back grinding, the thicker P+ substrate allows for lower lateral resistance to flow of drain current. Preferably, the bottom of die 30 surface may be rough and unpolished to increase its surface area to assist in heat removal from the chip, as illustrated in FIG. 20.

After metal, a silicon nitride (or other dielectric) passivation layer is deposited. The silicon nitride passivation is patterned to leave 4 openings per die with a pitch, for example, of 0.8 mm. The die size may typically be about 0.060"×0.060". Larger devices of 0.123"×0.023" are also typical. The silicon is so designed as to provide a 20 volt P-channel device with an R*A of 46.8 ohm-mm$^2$ at Vgs of 4.5 volt.

While a metal layer is not required on the bottom surface of substrate 50, it can be useful to use such a metal layer as a current conductor or to make thermal contact to a heat sink.

Figure 9:
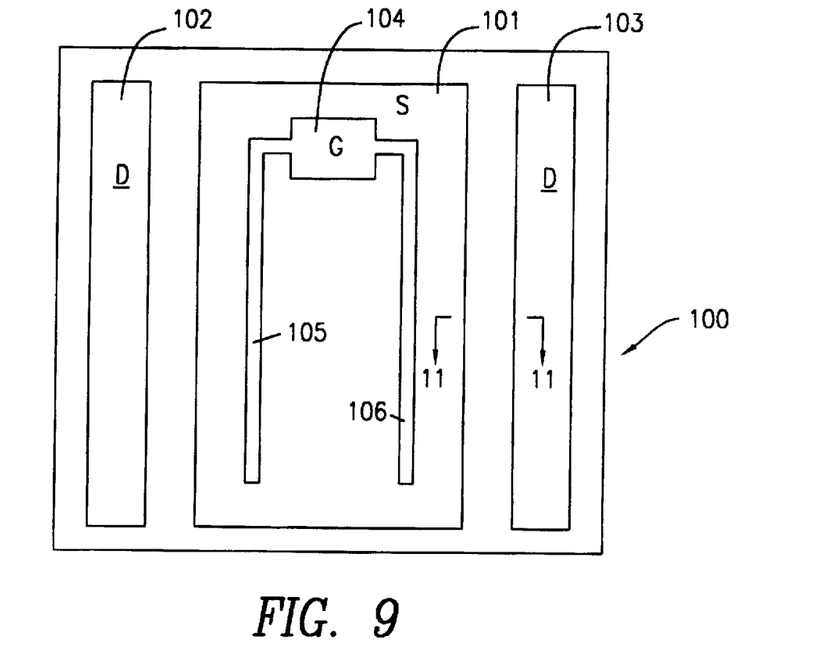
FIG. 9 is a top view of the metallized top surface of another embodiment of the invention.
Figure 10:
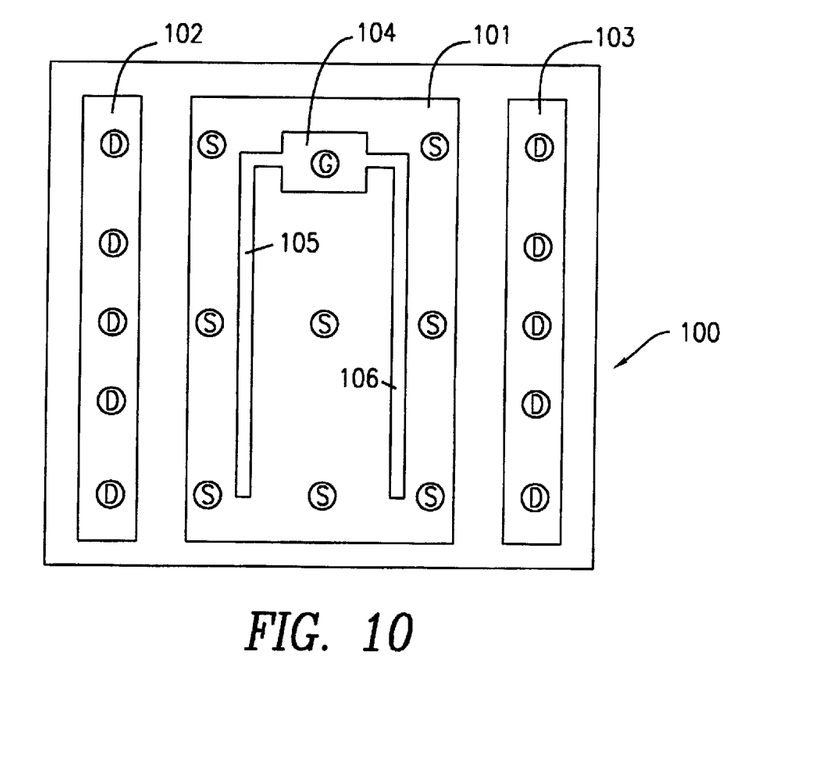
FIG. 10 shows FIG. 9 with rows of contact balls in place.

Other surface geometries, with a larger number of solder balls for higher current capacity can also be used. Thus, as shown in FIGS. 9 and 10, a larger die 100 can be laid out so that its top surface provides a source electrode 101, two drain electrodes 102 and 103 bordering the opposite edges of the die 100 and a gate pad 104 with runners or bus 105, 106. As shown in FIG. 10, each of drain electrodes 102 and 103 receive 5 solder balls, aligned in respective rows, and source 101 receives 8 solder balls also aligned in parallel rows. A single solder ball is connected to gate pad 104. By aligning the solder balls in respective parallel rows, the respective conductive traces on the printed circuit board receiving the device can be laid out in simple straight lines.

Figure 11:
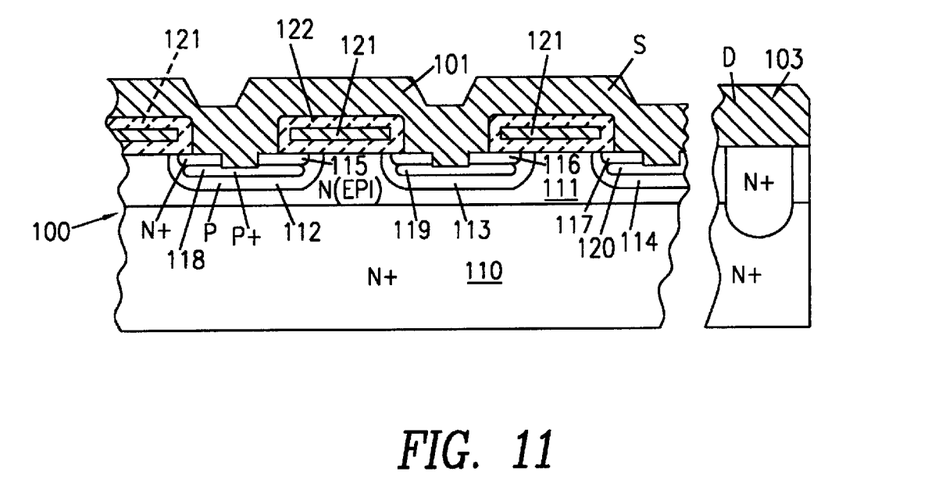
FIG. 11 is a cross-section of FIG. 9 for a planar junction pattern instead of the trench structure of FIG. 4.

FIG. 11 shows how the device of FIG. 9 can be carried out with planar technology, and as an N channel device. Thus, in FIG. 11, die 100 is formed with an $N^+$ substrate 110, an N type epitaxial (epi) layer 111 and with spaced polygonal P channel diffusions 112, 113, 114. Each of diffusions 112, 113 and 114 receives an $N^+$ source diffusion 115, 116 and 117 respectively and a $P^+$ contact diffusion 118, 119 and 120 respectively. A suitable gate structure, including a polysilicon gate latice 121 overlies a conventional gate oxide and is covered by an insulation layer 122 to insulate the gate latice from overlying source electrode 101 which contacts the source regions and channel regions in the usual manner. An $N^+$ sinker provides a conductive path from the $N^+$ substrate to drain electrode 103.

Figure 12:
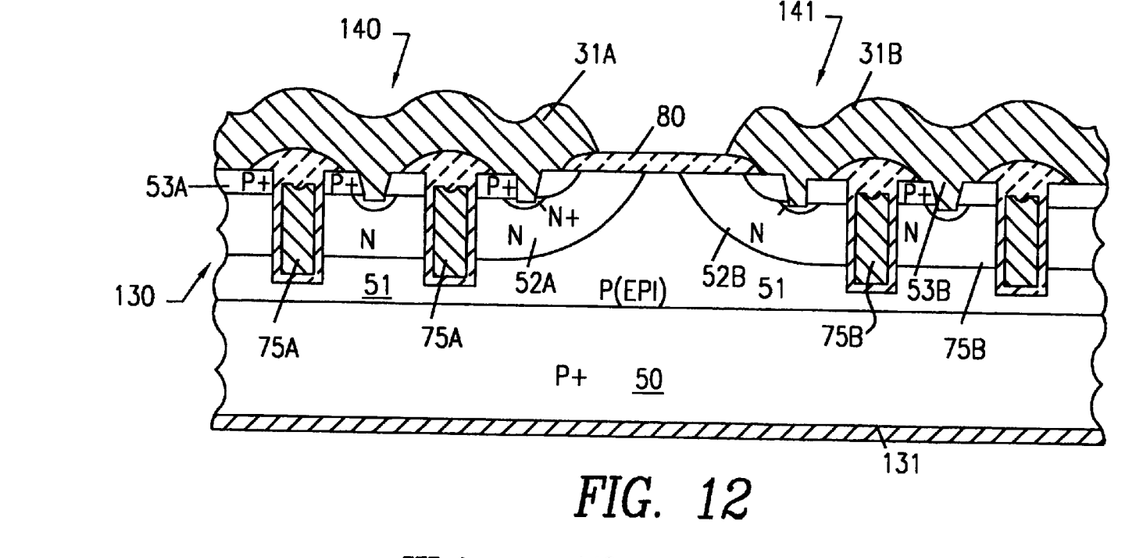
FIG. 12 is a cross-section of a further embodiment of the invention which is similar to that of FIG. 4 but uses two MOSFETs in a common chip, producing a bidirectional conduction device and is a cross-section of FIG. 14 taken across section line 12—12 in FIG. 14.

It is also possible to make the die with bidirectional conduction characteristics in which two series connected MOSFETs are integrated into a single chip. Thus, as shown in FIG. 12 the die can be formed in the manner of FIGS. 1 through 8 for a P channel trench implementation. Thus, using the numerals used in FIGS. 1 to 8, the bidirectional die 130 of FIG. 12 integrates two such devices in a single die. The two devices are identified with the numerals of FIG. 4, followed by an "A" and a "B" respectively, but with a common substrate 50. Two respective gate structures will also be provided, each having the structure of FIGS. 5 and 6. A substrate metallization 131 is also shown.

Figure 13:
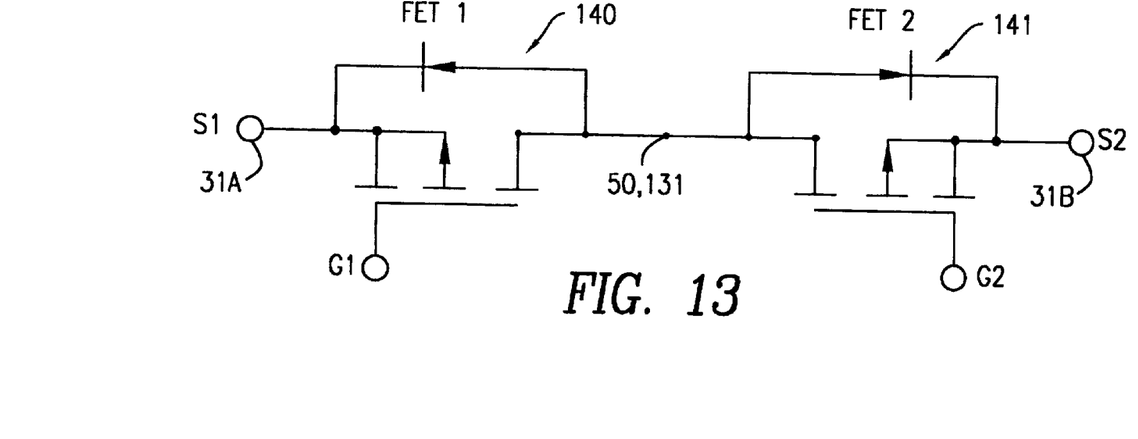
FIG. 13 is a circuit diagram of the device of FIG. 12.

The circuit diagram of the bidirectional device is shown in FIG. 13 and consists of two MOSFETs 140 and 141 having respective source terminals $S_1$ and $S_2$, respective gate terminals $G_1$ and $G_2$ and a common drain 50, 131, thereby to form the bidirectional conduction circuit. MOSFETs 140 and 141 are vertical conduction devices with respective body diodes (not shown in FIG. 13) which conduct when the other MOSFET is turned on.

Figure 14:
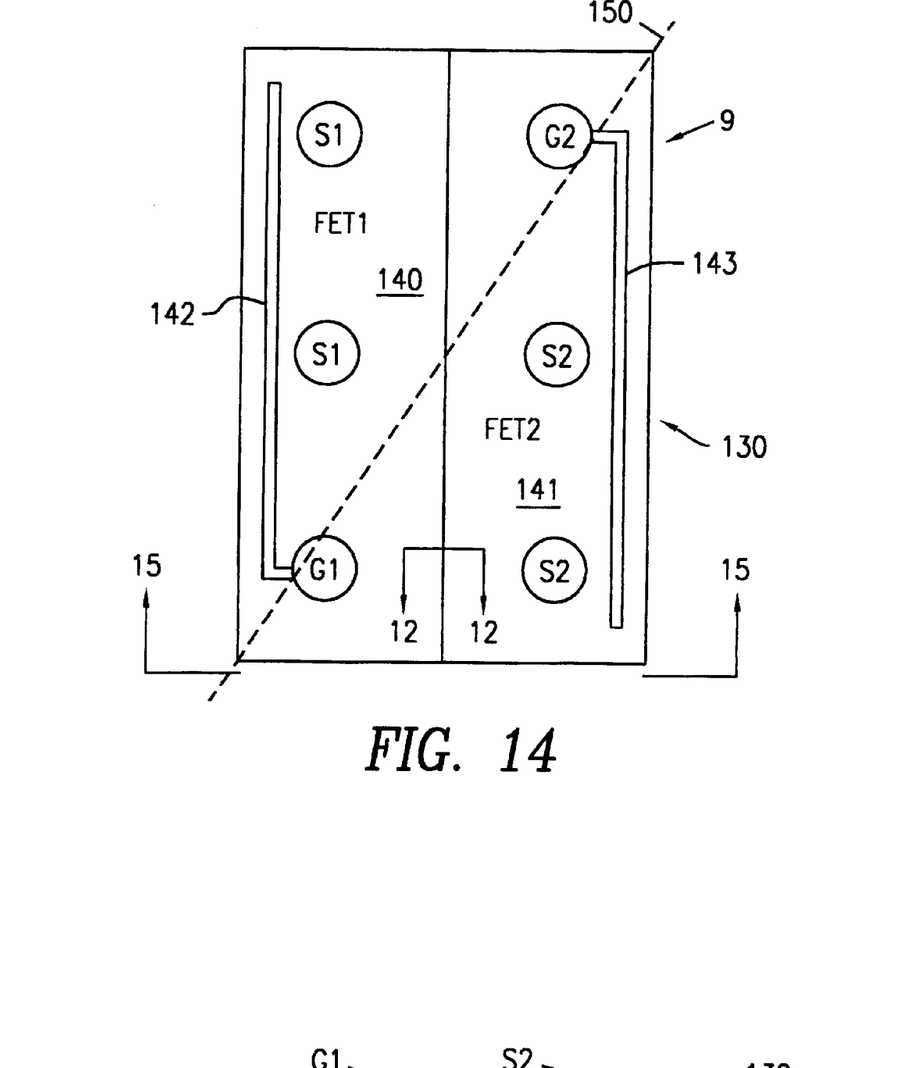
FIG. 14 is a top view of a device such as that of FIGS. 12 and 13.
Figure 15:
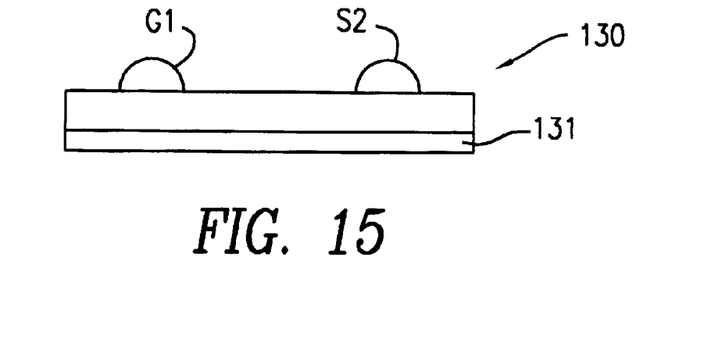
FIG. 15 is a front view of the device of FIG. 14.
Figure 16:
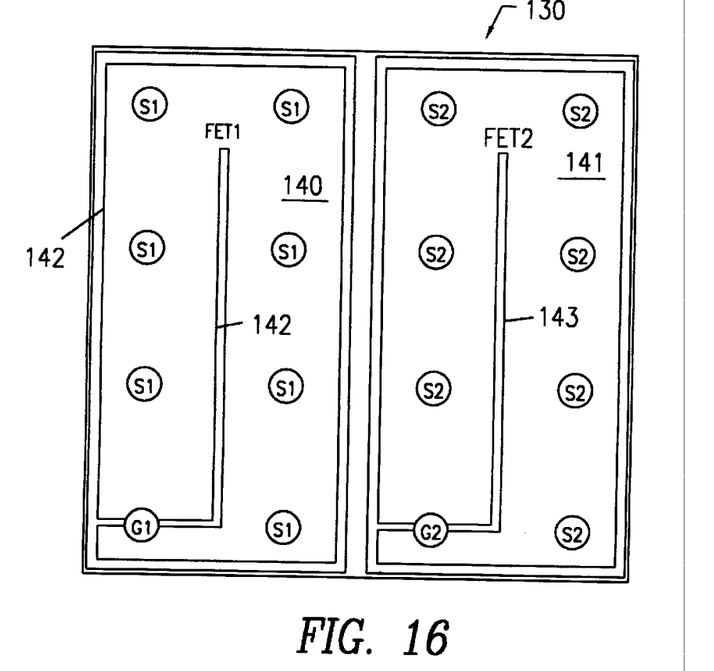
FIGS. 16 to 19 show further varients of the device of FIG. 14.
Figure 17:
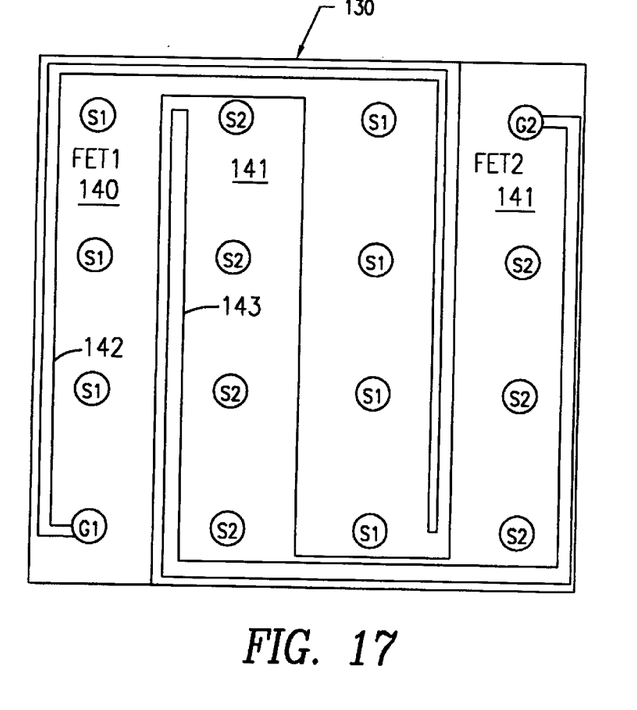
Figure 18:
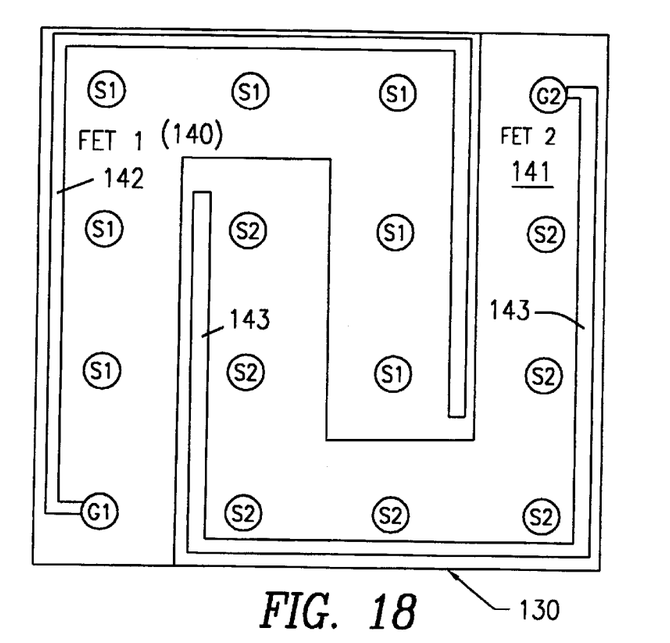

FIGS. 14 and 15 show a top view of the chip or die 130 of FIG. 12. The chip 130 may have the bottom conductive drain electrode 131 (FIG. 15) and will have respective gate ball electrodes $G_1$ and $G_2$ which may have respective gate runners or bus 142 and 143 respectively. Drain 131 electrode may be a thick low resistance metal layer (as compared to the conventional source electrode thickness). The bottom conductor 131 may be eliminated if $P^+$ substrate 50 has a high enough conductivity, but it can be useful as a heat sink.

The source electrodes of each of FETs 140 and 141 have two or more electrode bumps $S_1$ and $S_2$ as shown in FIG. 14. The distance between the $S_1$ bumps and $G_1$ bump is equal; as is the distance between the $S_2$ bumps and the $G_2$ bump.

In accordance with a further aspect of the invention, the height of chip or die 130 is greater than its width. Thus, it is a non-square, elongated rectangle. Further, the die bumps $S_1$, $S_2$, $G_1$ and $G_2$ are symmetric around a diagonal of the die 130, shown as dotted line diagonal line 150 in FIG. 14. Thus, the source and gate electrodes will be in the same location regardless of the up/down orientation of the chip. Since the die has rotational symmetry, no pin marking is necessary and simple pattern recognition apparatus can determine die orientation or placement during attachment to a surface.

As pointed out previously, and in accordance with the invention, the source balls S1 are in a line or row which is spaced from and parallel to the line of source balls S2.

Figure 19:
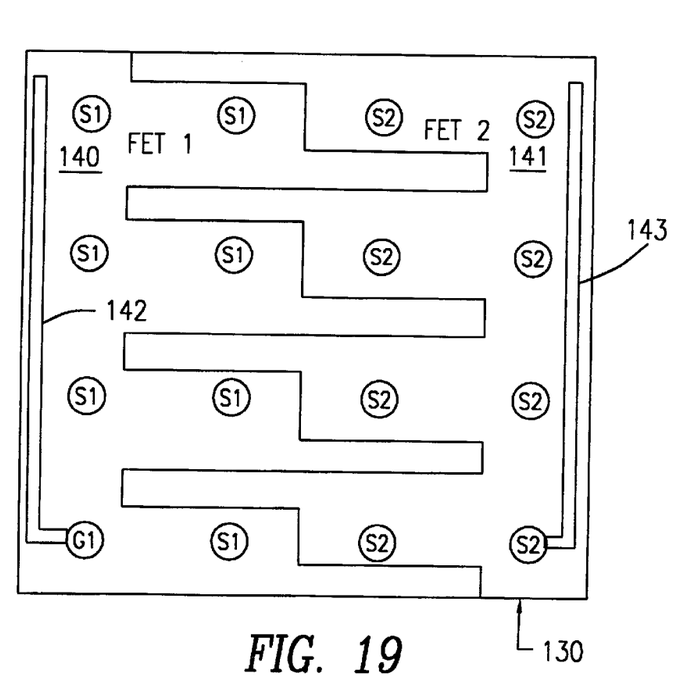

FIGS. 16, 17, 18 and 19 show alternate arrangements for FET1 (FET 140) and FET2 (FET 141) of FIGS. 13, 14 and 15 where similar numerals identify similar parts. The silicon die of FIGS. 16 to 19 may have an area of about 0.120"× 0.120". Note that in each case, source balls S1 and S2 lie in respective vertical and parallel rows, making it easy to use straight conductors for their parallel connection by either straight metal strips or straight metalizing lines on a printed circuit board. Further note that the sources of FETs 140 and 141 are interdigitated in FIGS. 17, 18 and 19 increasing the area of their connection. The arrangement of FIG. 19 is particularly advantageous, because it minimizes the distance current has to travel in the substrate, while keeping the two source metal bump sets together. In this way, both substrate and metal resistance are very low, while board level connection is very easy.

Although the present invention has been described in relation to particular embodiments thereof, many other variations and modifications and other uses will become apparent to those skilled in the art. It is preferred, therefore, that the present invention be limited not by the specific disclosure herein, but only by the appended claims.

What is claimed is:

1. A flip chip semiconductor device comprising a silicon wafer having parallel first and second major surfaces; at least one P region and at least one N region in said wafer which meet at a PN junction within said silicon wafer; first and second coplanar, laterally spaced and metallized areas formed on said first major surface and insulated from one another and connected to said P region and said N region respectively; said second major surface being intentionally roughened to define an exposed extended area for improved convection cooling for said semiconductor device.

2. The device of claim 1 which includes a third metallized layer atop said first major surface which is coplanar with and laterally spaced from said first and second metallized layers; said first, second and third metallized layers comprising source, drain and gate electrodes respectively of a MOSgated device.

3. The device of claim 1 which further includes at least one contact bump connected to each of said metallized layers.

4. The device of claim 2 which further includes at least one contact bump connected to each of said metallized layers.

5. A semiconductor device comprising a silicon die having first and second parallel surfaces; a region of one conductivity type extending from said first surface and into the body of said die; a junction pattern defined in said device formed by a plurality of laterally spaced diffusions of the other conductivity type into said region of one conductivity type; a first conductive electrode formed atop said first surface and in contact with said first plurality of diffusions; a second conductive electrode formed atop said first surface which is coplanar with and laterally spaced from and insulated from said first conductive electrode and in contact with the body of said die; and at least one solder ball connector formed atop each of said first and second conductive electrodes respectively; the current path from said first conductive electrode to said second conductive electrode having a vertical component which is generally perpendicular to said first surface.

6. The device of claim 5 wherein said device comprises a power MOSgated device; said first and second electrodes comprising the main power electrodes of said device.

7. The device of claim 6 wherein said device includes a polysilicon gate structure formed adjacent said plurality of diffusions and operable to turn said device on and off, and a third conductive electrode formed atop said first surface and coplanar with and laterally spaced from and insulated from said first and second conductive electrodes and connected to said polysilicon gate structure; and a solder ball connector connected to said third conductive electrode; all of said solder ball connectors being coplanar with one another.

8. The device of claim 5 wherein said device is a flip-chip power MOSFET.

9. The device of claim 5 wherein said one conductivity type is the P type.

10. The device of claim 7 wherein said one conductivity type is the P type.

11. The device of claim 5 wherein said region of one conductivity type includes an upper layer of relatively low concentration expitaxially formed silicon and a lower layer of higher concentration non-epitaxial silicon.

12. The device of claim 7 wherein said region of one conductivity type includes an upper layer of relatively low concentration expitaxially formed silicon and a lower layer of higher concentration non-epitaxial silicon.

13. The device of claim 7 wherein said second surface is roughened to define an extended area for improved cooling of said device.

14. The device of claim 5, wherein said solder balls are arranged on a pitch greater than about 0.8 mm and have diameters greater than about $200\mu$.

* * * * *